(12) United States Patent
Okutsu et al.

(10) Patent No.: US 11,183,484 B2
(45) Date of Patent: Nov. 23, 2021

(54) SEMICONDUCTOR MODULE, DIMM MODULE, MANUFACTURING METHOD OF SEMICONDUCTOR MODULE, AND MANUFACTURING METHOD OF DIMM MODULE

(71) Applicant: ULTRAMEMORY INC., Tokyo (JP)

(72) Inventors: Fumitake Okutsu, Tokyo (JP); Takao Adachi, Tokyo (JP)

(73) Assignee: ULTRAMEMORY INC., Tokyo (JP)

( * ) Notice: Subject to any disclaimer, the term of this patent is extended or adjusted under 35 U.S.C. 154(b) by 0 days.

(21) Appl. No.: 16/962,312

(22) PCT Filed: Nov. 11, 2019

(86) PCT No.: PCT/JP2019/044064
§ 371 (c)(1),
(2) Date: Jul. 15, 2020

(87) PCT Pub. No.: WO2021/095083
PCT Pub. Date: May 20, 2021

(65) Prior Publication Data
US 2021/0143129 A1    May 13, 2021

(51) Int. Cl.
*H01L 25/065* (2006.01)
*H01L 23/00* (2006.01)
*H01L 25/00* (2006.01)

(52) U.S. Cl.
CPC .......... *H01L 25/0657* (2013.01); *H01L 24/16* (2013.01); *H01L 24/32* (2013.01);
(Continued)

(58) Field of Classification Search
CPC ....... H01L 2225/06551; H01L 25/0657; H01L 2224/32145; H01L 2225/06589;
(Continued)

(56) References Cited

U.S. PATENT DOCUMENTS 5,347,428 A * 9/1994 Carson ................ H01L 25/0657
174/260
2007/0181991 A1  8/2007 Ishino et al.
(Continued)

FOREIGN PATENT DOCUMENTS

CN      101209003 A     6/2008
CN      108155174 A     6/2018
(Continued)

*Primary Examiner* — Jasmine J Clark
(74) *Attorney, Agent, or Firm* — Muncy, Geissler, Olds & Lowe, P.C.

(57) ABSTRACT

The present invention is intended to provide a semiconductor module and a DIMM module that are capable of stably supplying power to a plurality of stacked memory chips, a manufacturing method of the semiconductor module and a manufacturing method of the DIMM module. The semiconductor module 1 having a plurality of memory chips 21 includes: a memory substrate 10 having a power supply circuit 12 exposed on an arrangement surface as one surface of the memory substrate 10; and at least one memory unit 20 arranged over the arrangement surface of the memory substrate 10. The memory unit 20 includes: the plurality of memory chips 21 stacked together such that a stacking direction D is along the arrangement surface; a through electrode 22 passing through the plurality of memory chips 21 in the stacking direction D; and an electrode layer 23 formed on one end surface in the stacking direction D and connected to the through electrode 22 and the power supply circuit 12.

12 Claims, 9 Drawing Sheets

(52) U.S. Cl.
CPC .............. *H01L 24/73* (2013.01); *H01L 24/92* (2013.01); *H01L 25/50* (2013.01); *H01L 2224/16227* (2013.01); *H01L 2224/32145* (2013.01); *H01L 2224/73253* (2013.01); *H01L 2224/92242* (2013.01); *H01L 2225/06517* (2013.01); *H01L 2225/06541* (2013.01); *H01L 2225/06551* (2013.01); *H01L 2225/06589* (2013.01); *H01L 2924/1434* (2013.01)

(58) Field of Classification Search
CPC . H01L 24/73; H01L 25/50; H01L 2924/1434; H01L 2224/73253; H01L 24/92; H01L 24/32; H01L 2224/16227; H01L 24/16
See application file for complete search history.

(56) References Cited

U.S. PATENT DOCUMENTS

| | | | | |
|---|---|---|---|---|
| 2008/0301349 | A1* | 12/2008 | Bacha | .................... H05K 1/181 |
| | | | | 710/306 |
| 2010/0270668 | A1* | 10/2010 | Marcoux | ............... H01L 23/481 |
| | | | | 257/690 |
| 2018/0158809 | A1 | 6/2018 | Kim et al. | |

FOREIGN PATENT DOCUMENTS

| | | | |
|---|---|---|---|
| JP | 2007-194444 A | 5/1989 | |
| JP | H3-501428 A | 3/1991 | |
| WO | WO-89/04113 A1 | 5/1989 | |
| WO | WO-2006/121486 A2 | 11/2006 | |

* cited by examiner

SEMICONDUCTOR MODULE, DIMM MODULE, MANUFACTURING METHOD OF SEMICONDUCTOR MODULE, AND MANUFACTURING METHOD OF DIMM MODULE

TECHNICAL FIELD

The present invention relates to a semiconductor module, a DIMM module, a manufacturing method of the semiconductor module and a manufacturing method of the DIMM module.

BACKGROUND ART

Volatile memories (RAMS) such as a dynamic random access memory (DRAM) have conventionally been known as storage devices. The DRAM has been required to provide high performance and to have a large capacity capable of dealing with an increase in a data volume of an arithmetic device (hereinafter, referred to as a logic chip). In view of this, an attempt has been made to increase the capacity by miniaturizing memories (memory cell arrays, memory chips) and increasing the number of cells arranged planarly. On the other hand, this type of increase in capacity has approached a limit imposed by, for example, vulnerability to noise due to the miniaturization and an increase in die area.

To address this, in recent years, a technique has been developed which achieves a large capacity by stacking a plurality of planar memories in a three-dimensional (3D) manner. For example, a high-density electronic module has been proposed which includes a plurality of integrated circuit chips that are stacked and bonded together, and a linear electric conductor provided across the integrated circuit chips (see, for example, Patent Document 1).

Patent Document 1: Japanese Unexamined Patent Application (Translation of PCT Application), Publication No. H3-501428.

DISCLOSURE OF THE INVENTION

Problems to be Solved by the Invention

In the case of the high-density electronic module disclosed in Patent Document 1, a plurality of chip substrates are stacked to achieve an increase in density. This structure can achieve a higher density than a case where an integrated circuit chip is placed alone on a stack support substrate.

Meanwhile, the capacity of memory chips has increased in recent years. As a result, the power consumption of the memory chips has also tended to increase. In Patent Document 1, power is supplied through the electric conductor disposed on one side surface of the integrated circuit chips. Supplying power from only one side surface in this way may cause a shortage of power supplied to the plurality of memory chips having a large capacity. It is therefore favorable to stably supply power to such a plurality of stacked memory chips.

The present invention is intended to provide a semiconductor module and a DIMM module that are capable of stably supplying power to a plurality of stacked memory chips, a manufacturing method of the semiconductor module and a manufacturing method of the DIMM module.

Means for Solving the Problems

The present invention relates to a semiconductor module having a plurality of memory chips, the semiconductor module including: a memory substrate having a power supply circuit exposed on an arrangement surface as one surface of the memory substrate; and at least one memory unit arranged over the arrangement surface of the memory substrate. The memory unit includes: the plurality of memory chips stacked together in a stacking direction which is along the arrangement surface; a through electrode passing through the plurality of memory chips in the stacking direction; and an electrode layer formed on one end surface in the stacking direction and connected to the through electrode and the power supply circuit.

Preferably, the at least one memory unit includes a plurality of memory units, and the semiconductor module further includes an adhesive layer which is disposed between an adjacent pair of the memory units and which is in contact with the electrode layer of at least one of the adjacent pair of the memory units.

The semiconductor module preferably further includes a connecting portion which is disposed between one end of the electrode layer in an in-plane direction and the power supply circuit, and which electrically connects the electrode layer to the power supply circuit.

Preferably, each of the memory chips has, at one end adjacent to the memory substrate, a communicating portion capable of communicating with a communication circuit of the memory substrate.

Preferably, the semiconductor module further includes a mount portion which is disposed between the communicating portion and the communication circuit, and via which the memory units are mounted to the arrangement surface of the memory substrate.

Further, the present invention relates to a DIMM module including: the semiconductor module including a plurality of semiconductor modules; and a DIMM board having a placement surface as at least one surface thereof over which the plurality of semiconductor modules are placed.

Further, the present invention relates to a DIMM module including: the semiconductor module including a plurality of semiconductor modules; a DIMM board having a placement surface as at least one surface thereof over which the plurality of semiconductor modules are placed; and a heat spreader disposed across all the memory units of the plurality of semiconductor modules such that the heat spreader is in contact with the adhesive layers.

Furthermore, the present invention relates to a method for manufacturing a semiconductor module having a plurality of memory chips. The method includes: a memory unit forming step in which a memory unit is formed by stacking the memory chips together, forming a through electrode passing through the memory chips, and forming an electrode layer on one end surface in a stacking direction of the memory chips; a memory chip arrangement step in which the memory chips are arranged over a memory substrate having a power supply circuit exposed on an arrangement surface as one surface of the memory substrate, wherein one end of the electrode layer in an in-plane direction is positioned to face the power supply circuit; and a connection step in which the memory unit is electrically connected to the memory substrate.

Preferably, in the method for manufacturing the semiconductor module, the memory unit includes a plurality of memory units, and the method preferably further includes: an adhesive layer forming step in which an adhesive layer is formed on one surface of the electrode layer of the memory unit in the stacking direction, the adhesive layer being intended for bonding another of the memory units, the adhesive layer forming step being performed after the memory unit forming step and before the memory chip arrangement step; and a bonding step in which the two memory units are bonded to each other using the adhesive layer, the bonding step being performed after the adhesive layer forming step and before the memory chip arrangement step.

Preferably, the method for manufacturing the semiconductor module further includes: a singulation step in which the memory unit is singulated, the singulation step being performed after the memory unit forming step and before the adhesive layer forming step.

Moreover, the present invention relates to a method for manufacturing a DIMM module. The method includes: the above-described method for manufacturing the semiconductor module, wherein the manufactured semiconductor module includes a plurality of manufactured semiconductor modules; and a placement step in which the plurality of manufactured semiconductor modules are placed over a placement surface as at least one surface of a DIMM board.

Further, the present invention relates to a method for manufacturing a DIMM module. The method includes: the above-described method for manufacturing the semiconductor module, wherein the manufactured semiconductor module includes a plurality of manufactured semiconductor modules; a placement step in which the plurality of manufactured semiconductor modules are placed over a placement surface as at least one surface of a DIMM board; and a heat spreader arranging step in which a heat spreader is disposed across all the memory units of the plurality of semiconductor modules such that the heat spreader is in contact with the adhesive layers.

Effects of the Invention

The present invention provides a semiconductor module and a DIMM module that are capable of stably supplying power to a plurality of stacked memory chips, a manufacturing method of the semiconductor module and a manufacturing method of the DIMM module.

PREFERRED MODE FOR CARRYING OUT THE INVENTION

A semiconductor module 1 and a DIMM module 100 according to embodiments of the present invention and manufacturing methods thereof will be described below with reference to FIGS. 1 to 10. The semiconductor module 1 according to each embodiment is a memory member which has, for example, a plurality of memory chips 21 (DRAM chips) stacked together. The semiconductor module 1 is configured by, for example, arranging the plurality of stacked memory chips 21 over a substrate. At this time, the memory chips 21 are arranged over a memory substrate 10 such that a stacking direction D of the memory chips 21 is directed in an in-plane direction of the memory substrate 10, thereby enabling an increase in the number of the memory chips 21 of the semiconductor module 1.

First Embodiment

Figure 1:
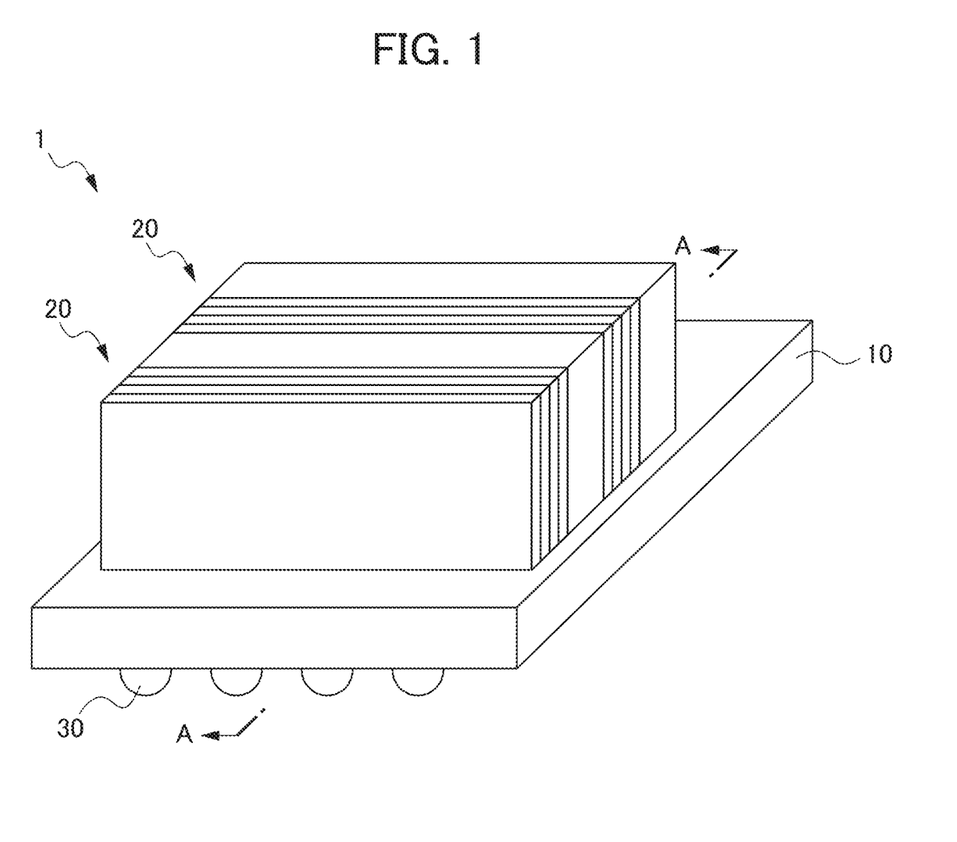
FIG. 1 is a perspective view showing a semiconductor module according to a first embodiment of the present invention.
Figure 2:
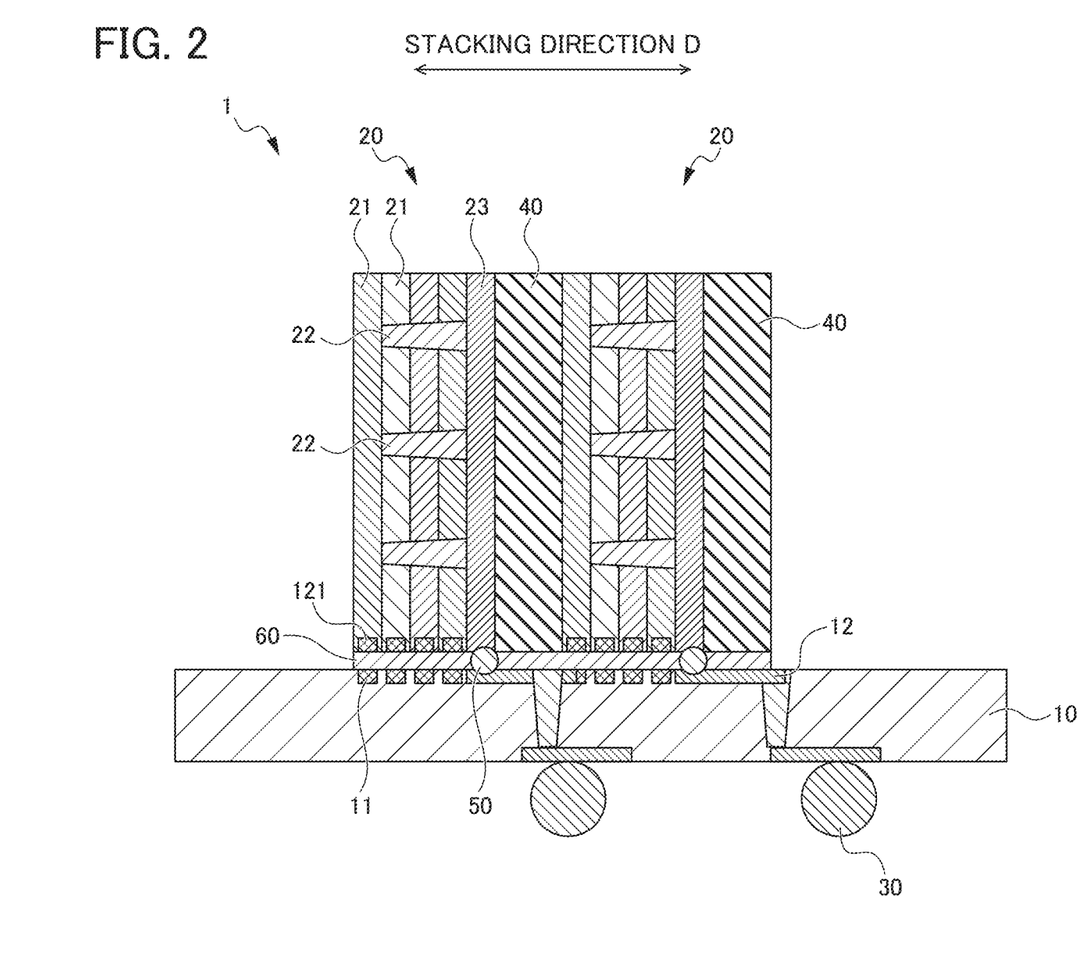
FIG. 2 is a cross-sectional view taken along line A-A in FIG. 1.

Next, the semiconductor module 1 and the DIMM module 100 according to a first embodiment of the present invention, and manufacturing methods thereof will be described with reference to FIGS. 1 to 6. The semiconductor module 1 according to the present embodiment is, for example, a DRAM module. As shown in FIGS. 1 and 2, the semiconductor module 1 has a plurality of memory chips 21. The semiconductor module 1 is configured by arranging the plurality of memory chips 21 along an in-plane direction of a memory substrate 10. The semiconductor module 1 includes the memory substrate 10, memory units 20, adhesive layers 40, connecting portions 50 and a mount portion 60. The adhesive layer 40 may be, for example, a film-shaped base material (not shown) having both surfaces coated with an adhesive. The adhesive layer 40 may function as a spacer for adjusting a space between the memory units 20 adjacent to each other. The memory units 20 will be described later.

The memory substrate 10 is a silicon substrate, for example. The memory substrate 10 is an active interposer, for example. Specifically, the memory substrate 10 has a plurality of electrodes penetrating the memory substrate 10 in a thickness direction. In the present embodiment, the memory substrate 10 has, as electrodes, power supply circuits 12 that are partially exposed on one surface of the memory substrate 10, the one surface serving as an arrangement surface. Further, the memory substrate 10 has communication circuits 11 (e.g., upper surface signal electrodes (non-contact communication circuits)) arranged on the one surface. In the present embodiment, the memory substrate 10 has the communication circuits 11 capable of non-contact communication. The memory substrate 10 has, on the other surface, bumps 30 which are electrically connectable to another substrate or the like.

The memory unit 20 is formed by stacking the plurality of memory chips 21. At least one memory unit 20 is arranged over the arrangement surface of the memory substrate 10. In this embodiment, two memory units 20 are arranged. Each memory unit 20 includes the memory chips 21, through electrodes 22, and an electrode layer 23.

Each memory chip 21 is a rectangular plate-like body in front view, and includes a memory circuit. The plurality of memory chips 21 are stacked together. In this embodiment, four memory chips 21 are stacked together. The memory chips 21 are arranged such that the stacking direction D is along the arrangement plane. The memory chip 21 has, at one end adjacent to the memory substrate 10, a communicating portion 121 (e.g., a side surface signal electrode (non-contact communication circuit)) that is capable of communicating with the memory substrate 10.

The through electrode 22 is a via made of a conductor such as a metal. The through electrode 22 passes through the plurality of memory chips 21 in the stacking direction D. Specifically, the through electrode 22 extends in the stacking direction D from the memory chip 21 arranged at one end to the memory chip 21 arranged before the memory chip 21 at the other end, while penetrating these memory chips 21. In this embodiment, a plurality of through electrodes 22 are provided.

The electrode layer 23 is, for example, a plate-like body made of a conductor such as metal. The electrode layer 23 is stacked on one end face in the stacking direction D, and is connected to the through electrodes 22 and the power supply circuit 12. Specifically, the electrode layer 23 is stacked on one surface of the memory chip 21 arranged at one end in the stacking direction D, and is connected to the through electrodes 22 and the power supply circuit 12.

The adhesive layer 40 is a plate-like member which is rectangular in front view. The adhesive layer 40 is formed in the same or substantially the same size as the electrode layer 23, as viewed in the stacking direction D. The adhesive layer 40 is disposed between the pair of memory units 20 arranged adjacent to each other. The adhesive layer 40 is in contact with the electrode layer 23 of at least one of the memory units 20. Thus, the adhesive layer 40 bonds the pair of memory units 20 to each other. The adhesive layer 40 is made of an insulating material. In this embodiment, the adhesive layer 40 is made of a material having a relatively high thermal conductivity (e.g., a base material such as beryllium oxide).

The connecting portion 50 is made of a conductor such as a metal. The connecting portion 50 is, for example, a micro-bump. The connecting portion 50 is arranged between an end of the electrode layer 23 in an in-plane direction and the power supply circuit 12. The connecting portion 50 electrically connects the electrode layer 23 to the power supply circuit 12. Thus, the connecting portion 50 is capable of providing power from the power supply circuit 12 of the memory substrate 10 to the electrode layer 23.

The mount portion 60 is disposed between the memory substrate 10 and the memory chips 21. That is, the mount portion 60 is disposed between the communicating portions 121 and the communication circuits 11. By way of the mount portion 60, the memory units 20 are mounted to the arrangement surface of the base.

Next, operation of the semiconductor module 1 according to the present embodiment will be described. The memory substrate 10 supplies power to the connecting portions 50 through the bumps 30, the electrodes penetrating the memory substrate 10 in the thickness direction, and the power supply circuits 12. The connecting portions 50 supply power to the electrode layers 23 of the memory units 20. Then, the electrode layers 23 supply power to each of the memory chips 21 through the plurality of through electrodes 22.

Each memory chip 21 communicates with the communication circuit 11 through the communicating portion 121. Thus, each memory chip 21 is configured to directly communicate with the memory substrate 10. In other words, each memory chip 21 is capable of communicating without being affected by, for example, synchronization with the other memory chips 21.

Next, a method for manufacturing the semiconductor module 1 according to the present embodiment will be described. The method for manufacturing the semiconductor module 1 according to the present embodiment includes: a memory unit forming step, a singulation step, an adhesive layer forming step, a bonding step, a mount portion arranging step, a connecting portion forming step, a memory chip arranging step and a connecting step.

Figure 3:
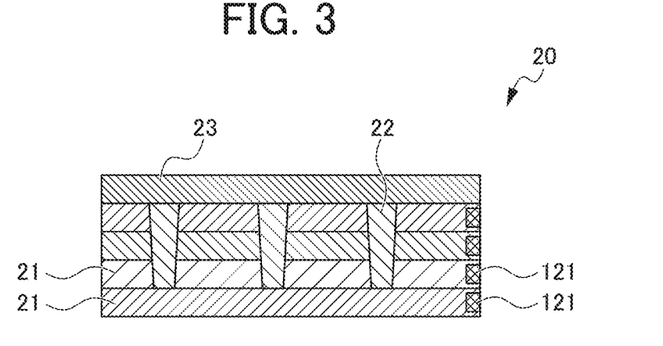
FIG. 3 is a schematic diagram showing a process step of a method for manufacturing the semiconductor module according to the first embodiment.

First, as shown in FIG. 3, a memory unit 20 is formed in the memory unit forming step. Specifically, a plurality of memory chips 21 are stacked together, and then, through electrodes 22 and an electrode layer 23 are formed. That is, the memory chips 21 are stacked together, the through electrodes 22 that penetrate the memory chips 21 are formed, and the electrode layer 23 is formed on one end surface in a stacking direction D of the memory chips 21, whereby the memory unit 20 is formed. Here, a plurality of memory units 20 are formed while being connected to each other in a direction intersecting with the stacking direction D. That is, the memory units 20 are formed such that the plurality of memory chips 21 are arranged parallelly in the direction intersecting with the stacking direction D.

Next, the singulation step is performed. The singulation step is performed after the memory unit forming step and before the adhesive layer forming step. In the singulation step, the memory unit 20 is singulated. For example, dicing is performed to singulate the memory unit 20 formed in the memory unit forming step.

Figure 4:
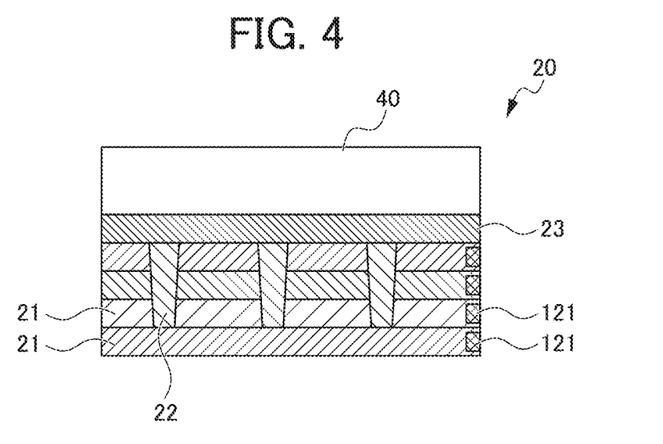
FIG. 4 is a schematic diagram showing a process step of the method for manufacturing the semiconductor module according to the first embodiment.

Next, the adhesive layer forming step is performed. As shown in FIG. 4, in the adhesive layer forming step, an adhesive layer 40 is formed on one surface of the electrode layer 23 of the memory unit 20 in the stacking direction D, the adhesive layer 40 being intended for bonding another memory unit 20.

Figure 5:
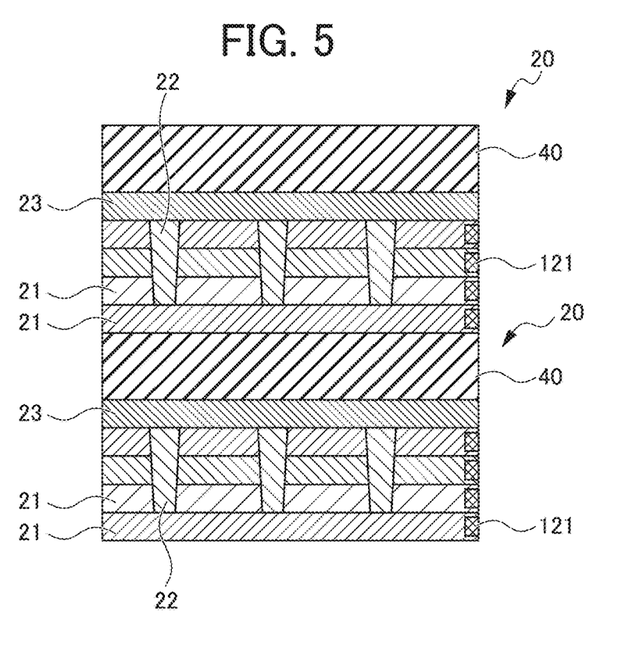
FIG. 5 is a schematic diagram showing a process step of the method for manufacturing the semiconductor module according to the first embodiment.

Next, the bonding step is performed. As shown in FIG. 5, the two memory units 20 are bonded to each other by way of the adhesive layer 40. As a result, the two memory units 20 are placed on each other in the stacking direction D.

Next, the mount portion arranging step is performed. In the mount portion arranging step, for example, as shown in FIG. 2, a layer-shaped mount portion 60 is disposed at a position overlapping with communication circuits 11 of the memory substrate 10.

Figure 6:
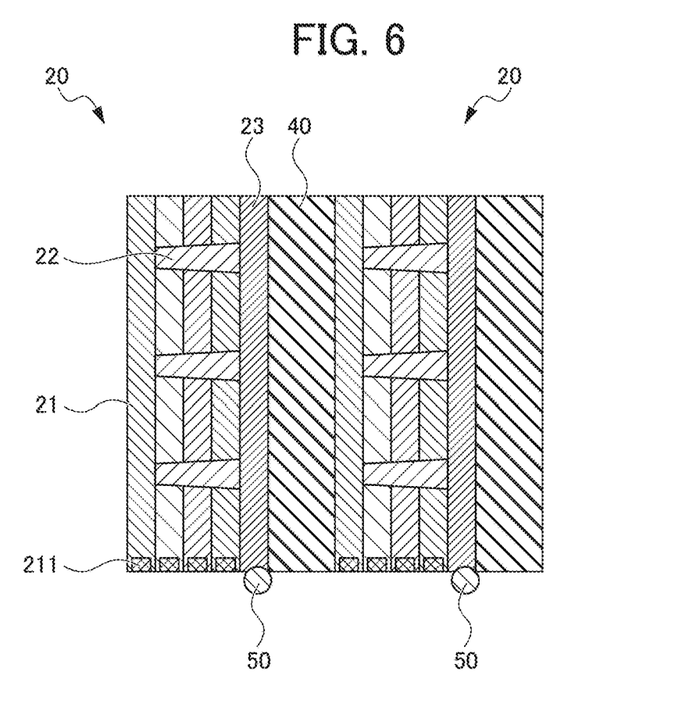
FIG. 6 is a schematic diagram showing a process step of the method for manufacturing the semiconductor module according to the first embodiment.

Subsequently, the connecting portion forming step is performed. In the connecting portion forming step, as shown in FIG. 6, a connecting portion 50 is formed at one end (one side surface) of each electrode layer 23 in an in-plane direction. In the connecting portion forming step, the connecting portion 50 is formed on each of the memory units 20.

Next, the memory chip arranging step is performed. In the memory chip arranging step, the memory chips 21 are arranged over the memory substrate 10 having power supply circuits 12 exposed on an arrangement surface as one surface of the memory substrate 10. In the memory chip arranging step, one end of the electrode layer 23 in an in-plane direction is positioned to face the power supply circuit 12.

Next, the connecting step is performed. In the connection step, the memory units 20 are electrically connected to the memory substrate 10. Thereafter, bumps 30 which can be electrically connected to another substrate or the like are formed on the other surface of the memory substrate 10. As a result, the semiconductor module 1 as shown in FIGS. 1 and 2 is formed.

The semiconductor module 1 according to the first embodiment described above and the manufacturing method thereof achieve the following effects.

A semiconductor module 1 having a plurality of memory chips 21 includes: a memory substrate 10 having a power supply circuit 12 exposed on an arrangement surface as one surface of the memory substrate 10; and at least one memory unit 20 arranged over the arrangement surface of the memory substrate 10. The memory unit 20 includes the plurality of memory chips 21 stacked together in a stacking direction D which is along the arrangement surface; a through electrode 22 passing through the plurality of memory chips 21 in the stacking direction D; and an electrode layer 23 formed on one end surface in the stacking direction D and connected to the through electrode 22 and the power supply circuit 12. This feature makes it possible to supply power to each of the memory chips 21 from the memory substrate 10 through the electrode layer 23 and the through electrode 22. Thus, this feature can stabilize power supply, as compared with a case where power is supplied to memory chips 21 from one side surface. Therefore, the semiconductor module 1 is provided which is capable of achieving a large capacity memory.

In the semiconductor module 1, the at least one memory unit 20 includes a plurality of memory units 20, and the semiconductor module 1 further includes an adhesive layer 40 which is disposed between an adjacent pair of the memory units 20 and which is in contact with the electrode layer 23 of at least one of the adjacent pair of the memory units 20. This feature makes it possible to arrange the memory units 20 bonded to each other such that the stacking direction D is along an in-plane direction of the memory substrate 10. Therefore, mounting of the memory units 20 to the memory substrate 10 can be further facilitated. Further, by using a material having a high thermal conductivity as the adhesive layer 40, an effect as a heat sink is expected to be exerted.

The semiconductor module 1 further includes a connecting portion 50 which is disposed between one end of the electrode layer 23 in an in-plane direction and the power supply circuit 12, and which electrically connects the electrode layer 23 to the power supply circuit 12. This feature enables electrical connection between the memory substrate 10 and the electrode layer 23, thereby stabilizing power supply from the memory substrate 10 to the memory units 20.

Each of the memory chips 21 has, at one end adjacent to the memory substrate 10, a communicating portion 121 capable of communicating with the memory substrate 10. With this feature, each of the memory chips 21 can communicate with the memory substrate 10 without being affected by the other memory chips 21. Therefore, the semiconductor module 1 can be provided which includes the memory chips 21 having relatively short latency, as compared with a case in which communication with all memory chips 21 is implemented through one of the memory chips 21 disposed at one end in a stacking direction D.

The semiconductor module 1 further includes a mount portion 60 which is disposed between the communicating portion 121 and a communication circuit 11, and via which the memory units 20 are mounted to the arrangement surface of the substrate. With this feature, side surfaces of the memory chips 21 are mounted to the memory substrate 10, thereby enabling the memory units 20 to be stably attached to the substrate 10.

A method for manufacturing a semiconductor module 1 having a plurality of memory chips 21 includes: a memory unit forming step in which a memory unit 20 is formed by stacking the memory chips 21 together, forming a through electrode 22 passing through the memory chips 21, and forming an electrode layer 23 on one end surface in a stacking direction D of the memory chips 21; an arrangement step in which the memory chips 21 are arranged over a memory substrate 10 having a power supply circuit 12 exposed on an arrangement surface as one surface of the memory substrate 10, wherein one end of the electrode layer 23 in an in-plane direction is positioned to face the power supply circuit 12; and a connection step in which the memory unit 20 is electrically connected to the memory substrate 10. This feature enables the semiconductor module 1 in which power supply is stabilized to be easily achieved.

In the method for manufacturing the semiconductor module 1, the memory unit 20 includes a plurality of memory units 20, and the method further includes: an adhesive layer forming step in which an adhesive layer 40 is formed on one surface of the electrode layer 23 of the memory unit 20 in the stacking direction D, the adhesive layer 40 being intended for bonding another of the memory units 20, the adhesive layer forming step being performed after the memory unit forming step and before the arrangement step; and a bonding step in which the two memory units 20 are bonded to each other using the adhesive layer 40, the bonding step being performed after the adhesive layer forming step and before the arrangement step. This feature makes it possible to connect the memory units 20 easily. Thus, the plurality of memory units 20 to be arranged over the memory substrate 10 can be easily formed.

The method for manufacturing the semiconductor module 1 further includes a singulation step in which the memory unit 20 is singulated, the singulation step being performed after the memory unit forming step and before the adhesive layer forming step. This feature makes it possible to easily obtain the plurality of memory units 20.

Second Embodiment

Figure 7:
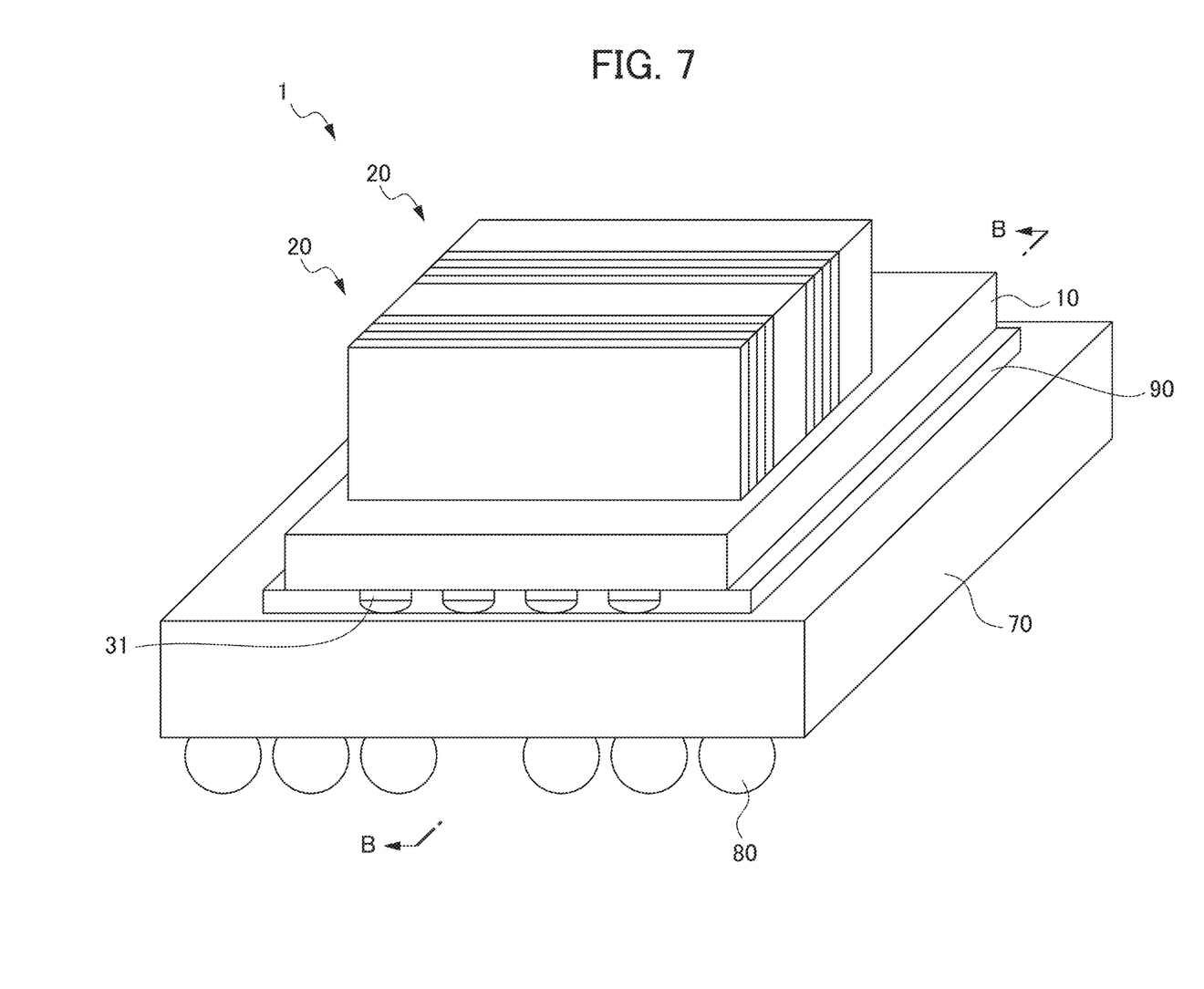
FIG. 7 is a perspective view showing a semiconductor package including a semiconductor module according to a second embodiment of the present invention.
Figure 8:
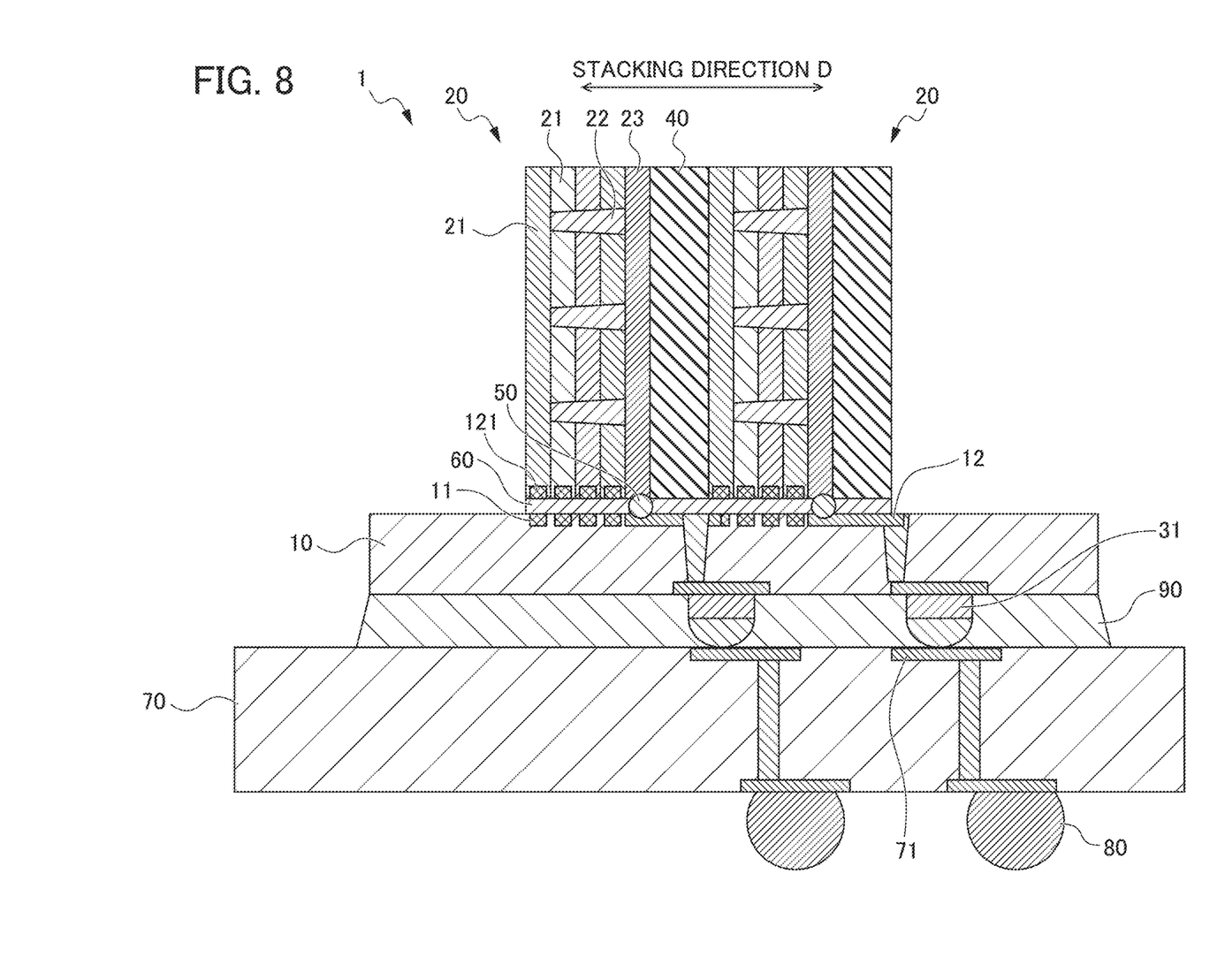
FIG. 8 is a cross-sectional view taken along line B-B in FIG. 7.

Next, a semiconductor module 1 and a manufacturing method thereof according to a second embodiment of the present invention will be described with reference to FIGS. 7 and 8. In the description of the second embodiment, the same components as those of the embodiment described above are denoted by the same reference characters, and description of the same components will be omitted or simplified. The semiconductor module 1 according to the second embodiment differs from that of the first embodiment in that the semiconductor module 1 of the second embodiment further includes a package substrate 70 and a sealing portion 90, as shown in FIGS. 7 and 8. The semiconductor module 1 according to the second embodiment further differs from that of the first embodiment in that the memory substrate 10 of the second embodiment has pillars 31 instead of the bumps 30.

The package substrate 70 is, for example, a silicon substrate or an organic substrate. The package substrate 70 has a larger area than the memory substrate 10. The package substrate 70 has package electrodes 71 that penetrate the package substrate 70 in a thickness direction or that form an electrical connection path. The package substrate 70 has one end surface facing the memory substrate 10 and the other end surface provided with solder balls 80 that are in contact with the exposed package electrodes 71.

The sealing portion 90 seals an interface between the memory substrate 10 and the package substrate 70. Specifically, the sealing portion 90 seals the interface between a surface opposite to the arrangement surface of the memory substrate 10 and the one end surface of the package substrate 70.

The pillars 31 are, for example, Cu pillars. An end of the pillar 31 is provided with, for example, solder that brings the power supply circuit 12 of the memory substrate 10 and the package electrode 71 of the package substrate 70 into conduction.

Next, a method for manufacturing the semiconductor module 1 of the present embodiment will be described. The semiconductor module 1 of the present embodiment is manufactured in the same manner as that of the semiconductor module 1 manufactured in the first embodiment, except that the bumps 30 are replaced with the pillars 31. Then, the pillars 31 are aligned with the package electrodes 71 of the package substrate 70 and brought into conduction by the solder provided at the ends of the pillars 31. Thereafter, sealing is implemented by the sealing portion 90. In this way, the semiconductor module 1 of the present embodiment is manufactured.

The above-described semiconductor module 1 and manufacturing method thereof according to the second embodiment achieve the following effects.

(9) The semiconductor module 1 further includes a package substrate 70 and a sealing portion 90. This feature makes it possible to provide the semiconductor module 1 with good handleability. For example, by employing a layout conforming to JEDEC Solid State Technology Association (JEDEC), a highly versatile semiconductor module 1 can be provided.

Third Embodiment

Next, a DIMM module 100 and a manufacturing method thereof according to a third embodiment of the present invention will be described with reference to FIGS. 9 and 10. The DIMM module 100 according to the third embodiment includes, in addition to a plurality of the semiconductor modules 1 according to the first or second embodiment, a DIMM board 101 and a heat spreader 102. The manufacturing method of the DIMM module 100 according to the third embodiment includes, in addition to the manufacturing method of the semiconductor module 1 of the first or second embodiment, a mounting step and a heat spreader arranging step.

Figure 9:
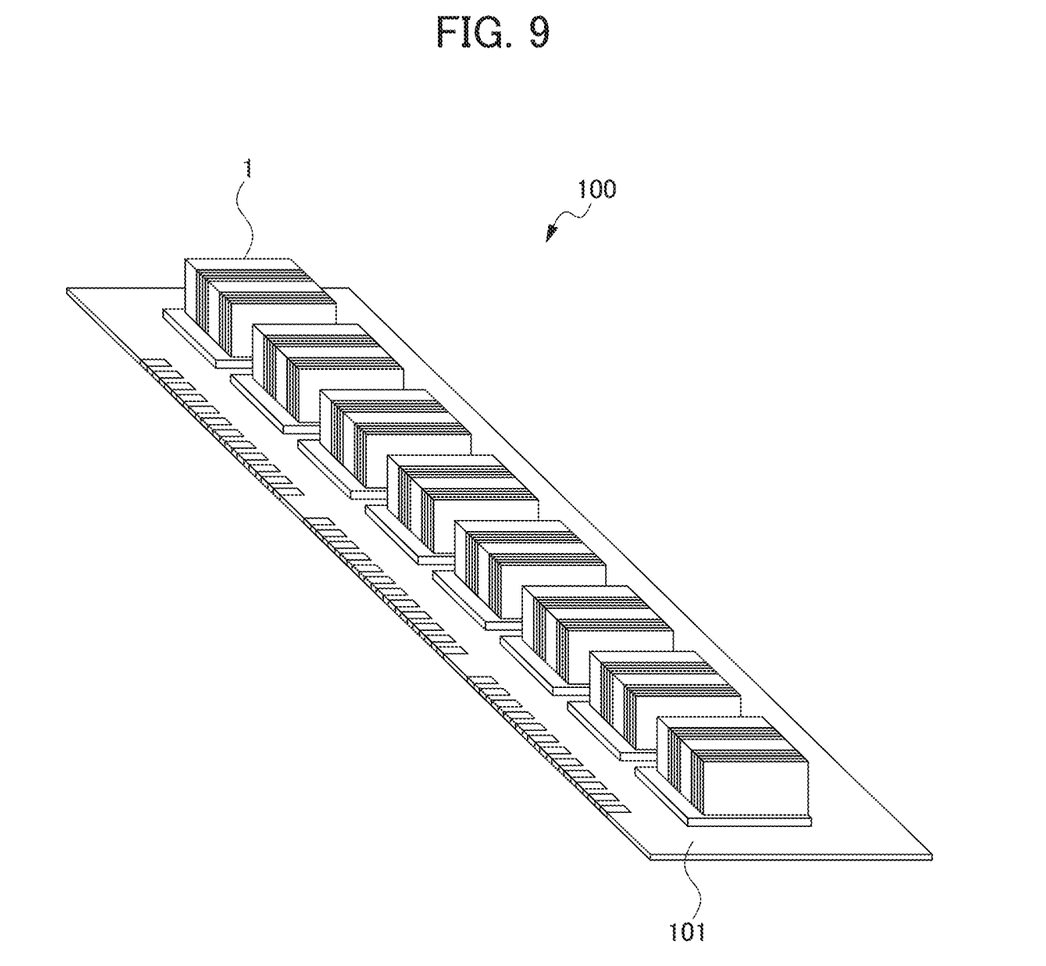
FIG. 9 is a perspective view showing a DIMM module according to a third embodiment of the present invention.

As shown in FIG. 9, over a placement surface as at least one surface of the DIMM board 101, the plurality of semiconductor modules 1 are placed. In this embodiment, eight semiconductor modules 1 are placed over the DIMM board 101.

Figure 10:
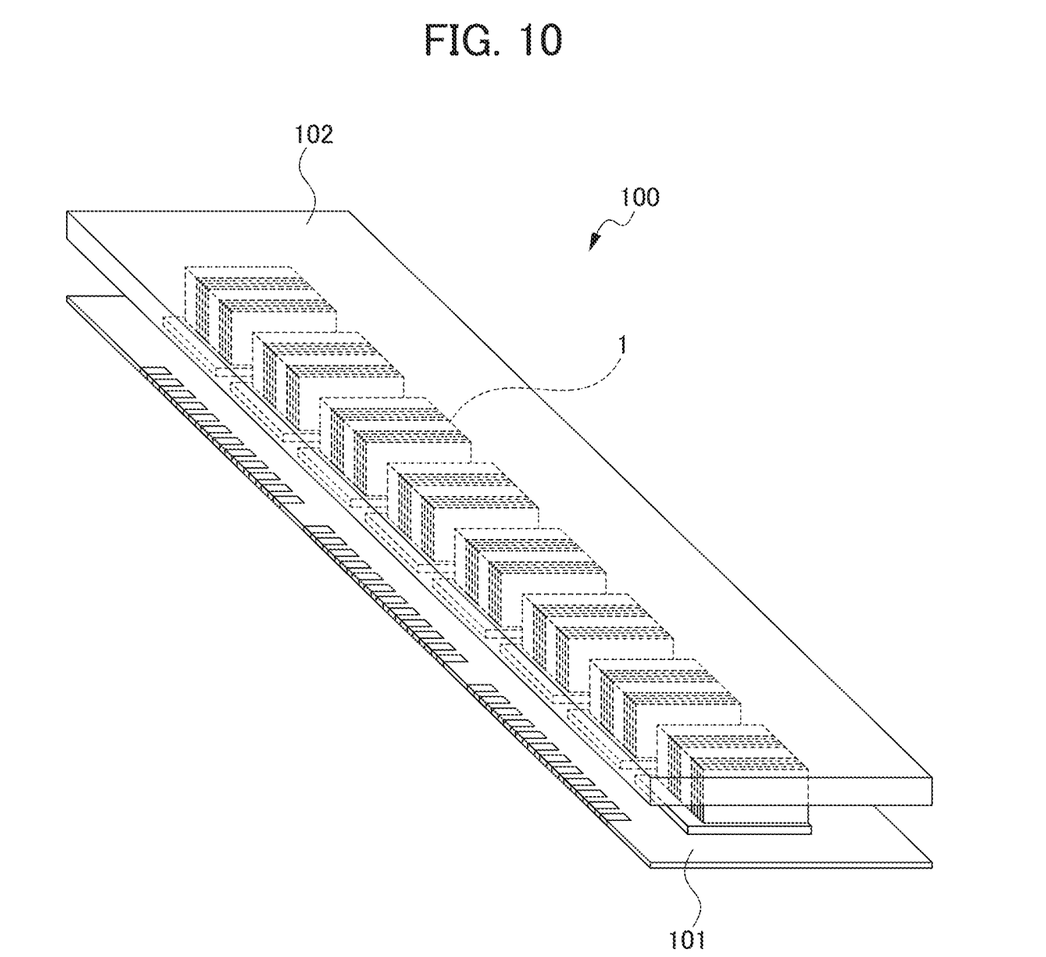
FIG. 10 is a perspective view showing the DIMM module with a heat spreader arranged thereon.

As shown in FIG. 10, the heat spreader 102 is a plate-like body having an area with which the heat spreader 102 can be disposed across the semiconductor modules 1 placed over the DIMM board 101. The heat spreader 102 is disposed across all the memory units 20 of the plurality of semiconductor modules 1, and is in contact with the adhesive layers 40.

Next, the method for manufacturing the DIMM module 100 according to the present embodiment will be described. In the mounting step, the plurality of manufactured semiconductor modules 1 are placed over the placement surface as at least one surface of the DIMM board 101. In the present embodiment, in the mounting step, the semiconductor modules 1 are arranged on one surface of the DIMM board 101 in a straight line at predetermined intervals.

Subsequently, the heat spreader arranging step is performed. In the heat spreader arranging step, the heat spreader 102 is arranged across all the memory units 20 of the plurality of semiconductor modules 1 and in contact with the adhesive layers 40.

Next, an example of the DIMM module 100 will be described. An assumption is made that the memory chip 21 has a chip thickness of 10 µm to 20 µm, the number of the memory chips 21 stacked in one memory unit 20 is four, the adhesive layer 40 has a thickness of 20 µm to 50 µm, and a maximum thickness after bonding of the plurality of memory units 20 is 5 mm. In this case, the number of the memory units 20 included in the semiconductor module 1 ranges from 83 to 38, which can be converted into the number of installed memory chips 21 ranging from 332 to 152. This means that by using chips of 2 GB (16 Gb), a memory capacity from 664 GB to 304 GB can be achieved. The DIMM module 100 having the eight semiconductor modules 1 can achieve a memory capacity of from 5312 GB to 2432 GB.

The semiconductor module 1 and a manufacturing method thereof according to the third embodiment described above achieves the following effects.

(10) A DIMM module 100 includes: the semiconductor module 1 including a plurality of semiconductor modules 1; a DIMM board 101 having a placement surface as at least one surface thereof over which the plurality of semiconductor modules 1 are placed; and a heat spreader 102 disposed across all the memory units 20 of the plurality of semiconductor modules 1 such that the heat spreader 102 is in contact with the adhesive layers 40. As a result, memory module having a large capacity can be achieved. Further, disposing the heat spreader 102 in contact with the adhesive layers 40 makes it possible to provide a DIMM module 100 having increased cooling effectiveness.

(11) A method for manufacturing a DIMM module 100 includes: the above described method for manufacturing the semiconductor module 1, wherein the manufactured semiconductor module 1 includes a plurality of manufactured semiconductor modules 1; a placement step in which the plurality of manufactured semiconductor modules 1 are placed over a placement surface as at least one surface of a DIMM board 101; and a heat spreader arranging step in which a heat spreader 102 is disposed across all the memory units 20 of the plurality of semiconductor modules 1 such that the heat spreader 102 is in contact with the adhesive layers 40. This feature makes it possible to manufacture a large capacity memory module having high cooling effectiveness.

Preferred embodiments of the semiconductor modules 1, the DIMM module 100 and the manufacturing methods thereof of the present invention have been described in the foregoing. However, the present invention is not limited to the above embodiments, and modifications can be made as appropriate.

For example, in the above embodiments, the semiconductor module 1 may include only one memory unit 20. In this case, the semiconductor module 1 does not have to include the adhesive layer 40.

Figure 11:
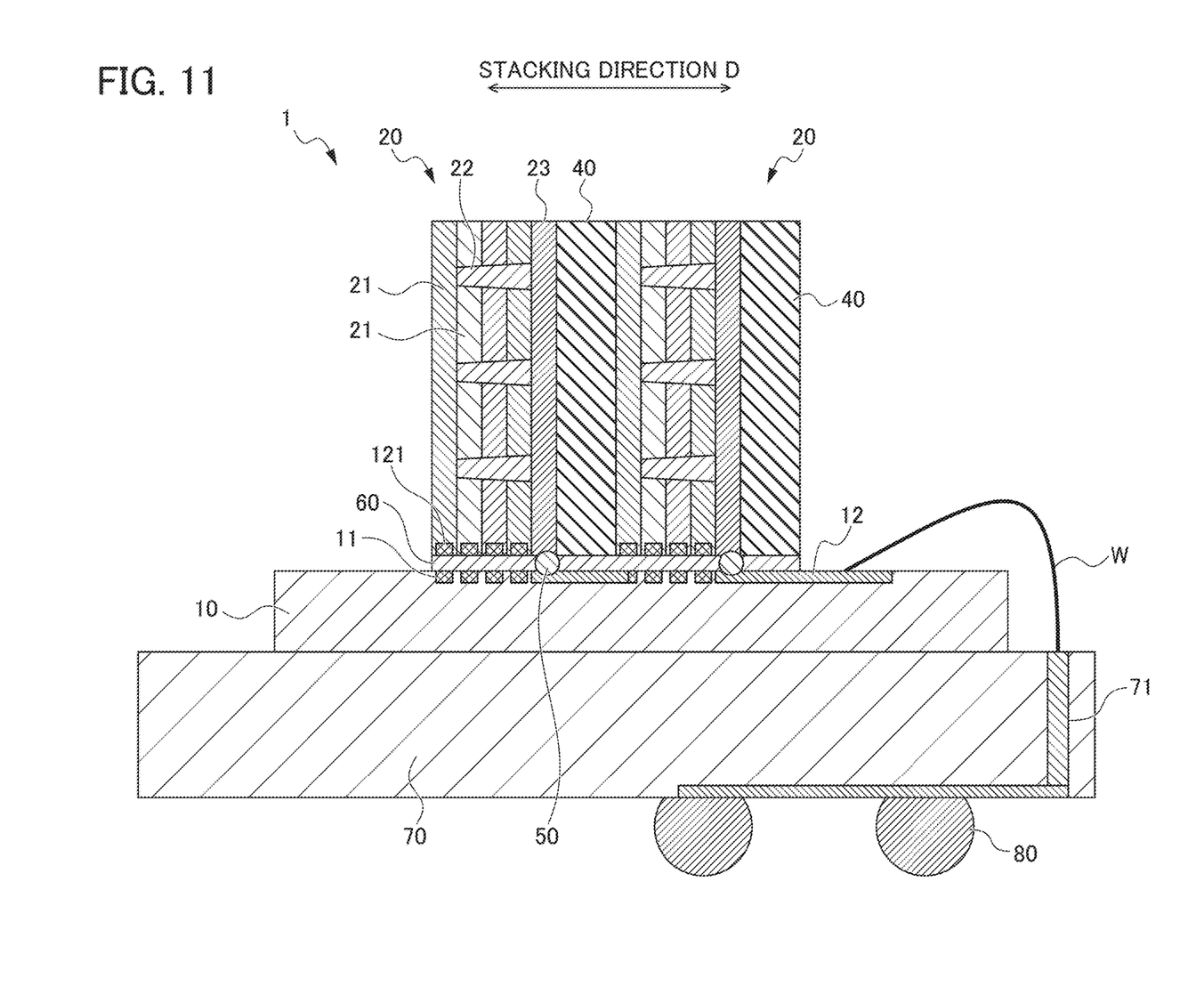
FIG. 11 is a perspective view showing a semiconductor module according to a modification of the present invention.

Further, in the second embodiment, as shown in FIG. 11, the memory substrate 10 may include, instead of the electrode penetrating the memory substrate 10 in the thickness direction, a power supply circuit 12 arranged on the arrangement surface and a wire W usable for wire bonding. With this configuration, the memory substrate 10 does not have to have the pillars 31. Further, the semiconductor module 1 may include no sealing material. In this case, the memory substrate 10 and the package substrate 70 are directly connected to each other. This configuration eliminates the need for the power supply electrode penetrating the memory substrate 10 in the thickness direction, enabling reduction of the manufacturing costs.

Furthermore, in the above embodiments, in the connecting portion forming step shown in FIG. 6, the one end (one side surface) of the electrode layer 23 in the in-plane direction is provided with the connecting portion 50. However, the present invention is not limited to this configuration. In the connecting portion forming step, the connecting portion 50 may be formed on an exposed surface of the power supply circuit 12 of the memory substrate 10. Then, in the arranging step, one end (one side surface) of the electrode layer 23 in the in-plane direction may be positioned in contact with the connecting portion 50. The memory chips 21 may be arranged over the memory substrate 10 in this way.

EXPLANATION OF REFERENCE NUMERALS

1: Semiconductor Module
10: Memory Substrate
11: Communication Circuit
12: Power Supply Circuit
20: Memory Unit
21: Memory Chip
22: Through Electrode
23: Electrode Layer
30: Bump
40: Adhesive Layer
50: Connecting Portion
60: Mount Portion
70: Package Substrate
71: Package Electrode
80: Solder Ball
90: Sealing Portion
100: DIMM Module
101: DIMM Board
102: Heat Spreader
121: Communicating Portion
D: Stacking Direction

The invention claimed is:

1. A semiconductor module having a plurality of memory chips, the semiconductor module comprising:
 a memory substrate having a power supply circuit exposed on an arrangement surface as one surface of the memory substrate; and
 at least one memory unit arranged over the arrangement surface of the memory substrate, wherein the memory unit includes:
  the plurality of memory chips stacked together in a stacking direction which is along the arrangement surface;
  a through electrode passing through the plurality of memory chips in the stacking direction; and
  an electrode layer formed on one end surface in the stacking direction and connected to the through electrode and the power supply circuit.

2. The semiconductor module according to claim 1, wherein
 the at least one memory unit comprises a plurality of memory units, and
 the semiconductor module further comprises an adhesive layer which is disposed between an adjacent pair of the memory units and which is in contact with the electrode layer of at least one of the adjacent pair of the memory units.

3. The semiconductor module according to claim 2, further comprising:
 a connecting portion which is disposed between one end of the electrode layer and the power supply circuit, and which electrically connects the electrode layer to the power supply circuit.

4. The semiconductor module according to claim 2, wherein
 each of the memory chips has, at one end adjacent to the memory substrate, a communicating portion capable of communicating with a communication circuit of the memory substrate.

5. The semiconductor module according to claim 4, further comprising:
 a mount portion which is disposed between the communicating portion and the communication circuit, and via which the memory units are mounted to the arrangement surface of the memory substrate.

6. A DIMM module comprising:
 a plurality of the semiconductor modules according to claim 1; and
 a DIMM board having a placement surface as at least one surface thereof over which the plurality of semiconductor modules are placed.

7. A DIMM module comprising:
 a plurality of the semiconductor modules according to claim 2;
 a DIMM board having a placement surface as at least one surface thereof over which the plurality of semiconductor modules are placed; and
 a heat spreader disposed across all the memory units of the plurality of semiconductor modules such that the heat spreader is in contact with the adhesive layers.

8. A method for manufacturing a semiconductor module having a plurality of memory chips, the method comprising:
 forming a memory unit by stacking the memory chips together, forming a through electrode passing through the memory chips, and forming an electrode layer on one end surface in a stacking direction of the memory chips;
 arranging the memory unit over a memory substrate having a power supply circuit exposed on an arrangement surface as one surface of the memory substrate, wherein the stacking direction of the memory chips is along the arrangement surface; and
 electrically connecting the memory unit to the memory substrate.

9. The method according to claim 8,
further comprising: forming an adhesive layer on one surface of the electrode layer of the memory unit in the stacking direction, the adhesive layer being intended for bonding another of the memory units, the forming the adhesive layer being performed after the forming the memory unit and before the arranging the memory unit; and
 bonding the two memory units to each other using the adhesive layer, the bonding being performed after the forming the adhesive layer and before the arranging the memory unit.

10. The method according to claim 9, further comprising: singulating the memory unit, the singulating the memory unit being performed after the forming the memory unit and before the forming the adhesive layer.

11. A method for manufacturing a DIMM module, the method comprising:
 the method for manufacturing the semiconductor module according to claim 8; and placing a plurality of the manufactured semiconductor modules over a placement surface, wherein the placement surface is as at least one surface of a DIMM board.

12. A method for manufacturing a DIMM module, the method comprising:
the method for manufacturing the semiconductor module according to claim 9;
placing a plurality of the manufactured semiconductor modules over a placement surface, wherein the placement surface is as at least one surface of a DIMM board; and
arranging a heat spreader across all the memory units of the plurality of semiconductor modules such that the heat spreader is in contact with the adhesive layers.

* * * * *